United States Patent [19]
Doi et al.

[11] 4,277,528
[45] Jul. 7, 1981

[54] CERAMIC SUBSTRATE

[75] Inventors: Takao Doi; Satoshi Nomura, both of Shiga, Japan

[73] Assignee: Kyoto Ceramic Kabushiki Kaisha, Japan

[21] Appl. No.: 96,237

[22] Filed: Nov. 20, 1979

[30] Foreign Application Priority Data

Nov. 25, 1978 [JP] Japan ............................. 53/145794

[51] Int. Cl.³ .......................... B32B 3/02; B32B 3/30
[52] U.S. Cl. ................................... 428/192; 428/80; 428/81; 428/44
[58] Field of Search ............... 428/157, 192, 210, 312, 428/446, 539, 901, 49, 80, 81, 83

[56] References Cited
U.S. PATENT DOCUMENTS

| 3,668,053 | 6/1972 | Ayres | 428/157 |
| 4,024,684 | 5/1977 | Holmgren | 428/157 |
| 4,030,004 | 6/1977 | Rutt | 428/192 |
| 4,164,442 | 8/1979 | Bartelmuss | 428/53 |
| 4,188,415 | 2/1980 | Takahashi et al. | 428/901 |

Primary Examiner—William J. Van Balen
Attorney, Agent, or Firm—Richard H. Zaitlen

[57] ABSTRACT

A ceramic substrate having a convex portion formed singly or plurally on the end faces of the circumference of the substrate so as to bring the convex portions into collision with each other prior to direct collision of the substrates with each other for the purpose of effectively preventing damage due to eventual collision of the end faces of the substrates with each other or corner portions during transfer to an assembling station by an automatic feeding means such as a sloping tray.

8 Claims, 4 Drawing Figures

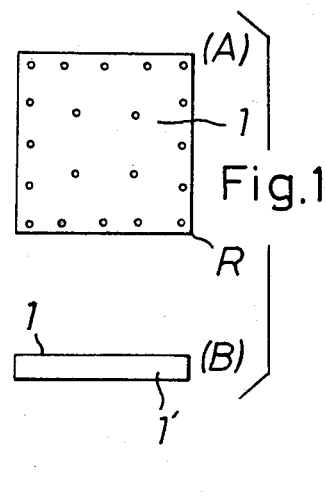
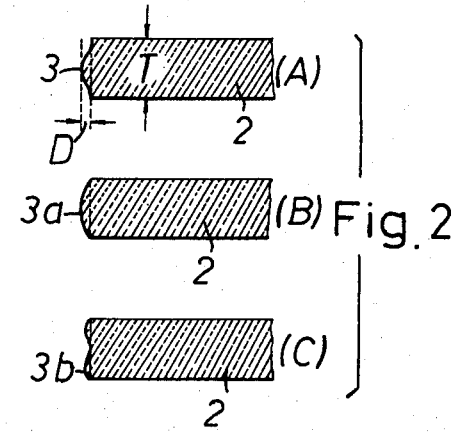
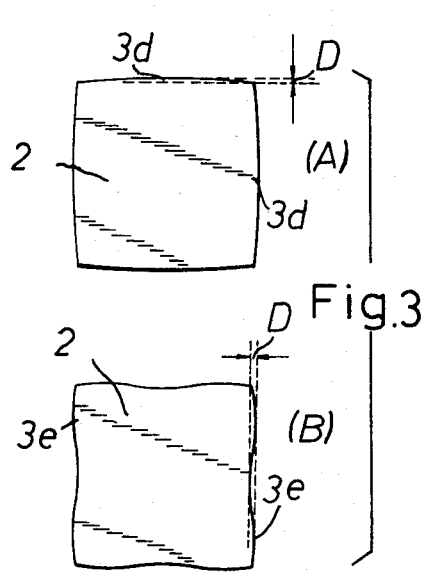
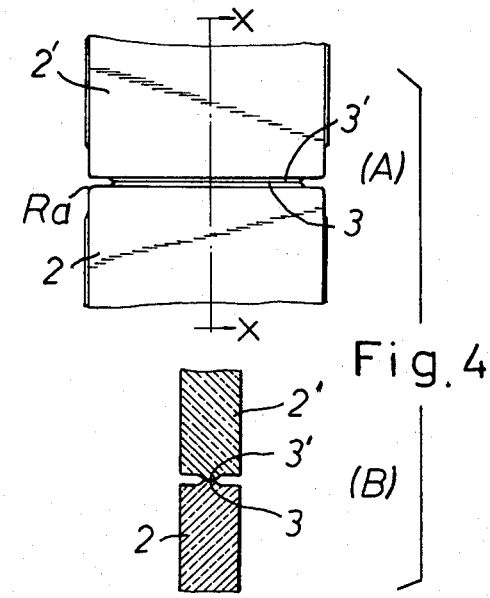

4,277,528

CERAMIC SUBSTRATE

BACKGROUND OF THE INVENTION

1. Field of the Invention

This invention relates to a ceramic substrate suitable for mounting thereon and receiving therein an element for an electronic device and more particularly to a ceramic substrate suitable for an element for semiconductive integrated circuit. The invention relates also to a method of automatically feeding ceramic substrates with the least possibility of damage thereto.

2. Prior Art

This kind of ceramic substrate heretofore in use is excellent in insulating property, chemical stability, wear resistance, high hardness, low thermal expansion rate, and the like, and particularly pre-eminently excellent in point of characteristics of material for receiving a semiconductive integrated circuit element therein, while on the other hand it is low in impulse resistance and, as apparent from a plan view and a side view of the ceramic substrate of the conventional type shown in FIGS. 1(A) and 1(B), the ceramic substrate 1 is planar on the end face 1' and, when the ceramic substrates collide with each other, collision of the end face 1' of one substrate 1 with that of another substrate 1 or collision of the end face 1' with the corner portion R of another substrate 1 often produces fissures, cracks, chips, etc. in the ceramic substrate 1. Accordingly, when, in the assembling of a semiconductor device, numerous working processes such as mounting of a semiconductive integrated circuit on the substrate 1, bonding of the circuit to the substrate 1 are automated, there is encountered a great obstacle such as repeated collision of one ceramic substrate with another as often as the substrates are transferred on an assembling conveyor line, which collision produces fissures, cracks, etc. in the ceramic substrate 1, with the result that reduction is made both in the yield and in the reliability of products.

SUMMARY OF THE INVENTION

Causes for producing cracks and chips due to collision of such ceramic substrates between themselves are attributed to various combined factors such as (1) configuration of outer end face of the substrate 1, (2) differences in vertical compression rate when the substrate is press formed, (3) temperature conditions in time of sintering, (4) outer surface roughness, (5) compounding ratio of material, etc. but experiments on the part of the present inventors with such causative factors show that it is an optimum means to prevent fissures, cracks, and chips by adjustment of the outer end face of the substrate mentioned in Item 1 above.

Accordingly, in view of the circumstances described above, the invention has for its object the provision of a ceramic substrate adapted to prevent fissures, cracks and/or chips to the greatest possible extent and the provision of method of automatically feeding the same.

A description will now be given of embodiments of the invention, by way of example only, with reference to the accompanying drawing.

BRIEF EXPLANATION OF THE DRAWING

FIGS. 1(A) and (B) are a top plan view and a side view respectively of a conventional type substrate;

FIGS. 2(A), (B) and (C) are fragmentary sectional views respectively of end edge portions formed on the ceramic substrate according to the invention;

FIGS. 3(A) and (B) show plan view respectively of other embodiments of the substrate according to the invention; and FIGS. 4(A) and (B) respectively illustrate aspects of collision of the ceramic substrate according to the invention.

DETAILED DESCRIPTION OF THE INVENTION

As shown in one embodiment of the invention in FIG. 2(A), there is a case wherein a convex (convex dilation) section 3 is formed on the edge face of the ceramic substrate 2 in the direction of vertical plane (thickness) thereof. In this case, the apex of the convex portion 3 is located in the middle of the end face in the direction of vertical plane of the substrate and convex height D is related also with the thickness T of the substrate 2. Suppose that thickness T is equal to 1.52 mm, it is found appropriate that convex height D is equal to the order of 0.02−0.1 mm and that D/T is approximately equal to 0.013−0.066. As shown in FIG. 4 which illustrates one example of collision of substrates with each other which have been formed with such convex portion 3 on the end face in the direction of vertical plane, the convex portions 3 and 3' on the end faces of the substrates 2 and 2' are brought into collision with each other. In this manner, because impact is applied to rounded convex portions 3, 3' which are less likely to be cracked or chipped, the invention can prevent application of impact to portions subject to cracking, chipping, etc. to protect the substrate 2 against damage.

Preferably, percentage of production of cracks, fissures, chips, etc. of the substrate 2 is greatly reduced by forming a convex portion 3 over the portion about 5% of one side away from each corner of four corners of the substrate 2.

In addition to the embodiment shown in FIG. 2(A), other embodiments of convex portion to be formed in the direction of vertical plane of the end face of the substrate 2 are respectively shown at $3a$–$3b$ in FIGS. 2(B)–(C) and still other convex portions are shown at $3d$ and $3e$ in FIGS. 3(A) and 3(B) in which the convex portions $3d$ and $3e$ are formed respectively on the end faces of the substrates in the direction of horizontal plane. In yet another embodiment, the convex portion $3d$ or $3e$ may be combined with one of the aforesaid convex portions in FIGS. 2(A)-(C).

A description will now be given of an embodiment of the invention in the following.

As an example are shown in a separate table results of collision tests conducted both on a ceramic substrate of the invention and on a conventional type ceramic substrate having the same configuration and flat end face as that of the invention, the ceramic substrate of the invention having a sectional configuration shown in FIG. 2(A) and having a square shape of 24.0 mm × 24.0 mm a thickness of 1.52 mm and a corner radius of 0.381 and having a convex portion 3 formed on the end face in the range of 0.02–0.05 mm in convex height D. As for collision test conditions, twenty substrates as a test group were arranged flat in side-by-side relation at a space of 50 cm on the top of a sloping tray 100 cm in length and 70° in gradient and were slidden down (dropped) by empty weight toward a stopper made of polyamide resin (nylon) and mounted at the lower end of the tray. This kind of downslide was repeated 10 times and those substrates which had been found cracked, fissures, and/or chipped by the end of ninth downslide were replaced by new substrates each time cracks, fissures, and chips were found. The number of cracks, fissures, and chips produced was summed up from one test group of 20 substrates which had finished a repetition of downslide 10 times.

having formed the substrate of ceramics by various other methods such as powder press-forming, stamping from a green sheet by a doctor blade process, and other extrusion method.

As described above, since convex portions are formed on the end faces of substrates, collision of the substrates which might occur between themselves could reduce production of fissures, cracks, chips and the like in a substantial degree. Accordingly, when for

TABLE I

| Substance & kind of samples tested | | Factor | Test group (One group of 20) | | | | | | | | | percent defect (%) in total |
|---|---|---|---|---|---|---|---|---|---|---|---|---|
| | | | A | B | C | D | E | F | G | H | I | |
| Conventional substrate | Square of 24.0 × 24.0 mm Thickness T = 1.52 mm End configuration is Flat | Fissures Cracks Chips Percent defect (%) | 1 5 0 30 | 4 2 1 35 | 2 5 0 40 | 5 4 1 50 | 2 7 0 45 | 2 2 1 25 | 0 6 0 30 | 4 4 0 40 | 5 5 0 50 | 38.3% |
| Substrate having convex portion | Square of 24.0 × 24.0 mm Thickness T = 1.52 mm Convex portion less than 0.02 mm high (0.015)mm on an average) was formed on the end face (Test example $\frac{D}{T} \approx 0.0099$) | Fissures Cracks Chips Percent defect (%) | 2 3 1 30 | 5 2 0 35 | 4 3 0 35 | 3 2 1 30 | 2 6 0 40 | 1 6 .1 35 | 4 5 0 45 | 3 4 0 35 | 5 3 0 40 | 36.1 % |
| | Square of 24.0 × 24.0 mm Thickness T = 1.52 mm Convex portion 0.02 mm high or over (0.1 mm on an average) was formed on the end face (The invention $\frac{D}{T} \approx 0.066$) | Fissures Cracks Chips Percent defect (%) | 0 2 0 10 | 1 0 0 5 | 0 1 0 5 | 0 0 0 0 | 1 1 0 10 | 0 2 0 10 | 0 1 0 5 | 1 2 0 15 | 1 0 0 5 | 7.2% |

As apparent from the test results shown in Table I, formation of a convex portion 0.1 mm in convex height on the end face of a ceramic substrate 1.52 mm in thickness reduced production of fissures, cracks, chips, and the like attributable to collision of the substrates between themselves to such a great degree as about 7.2%.

Also, substantially the same good results of collision tests were obtained from even the substrate having the end configuration on which were formed other such shapes of concave portion as shown in FIGS. 2(B) and (C) and in FIGS. 3(A) and (B).

On the other hand, the convex height D is not restricted strictly to the range of 0.02–0.1 mm, and an excess of the range of 0.1 mm rather increases the effect of preventing the fissures, cracks, chips or the like and, depending upon the circumstances under which the substrate is used, the formation of convex height D more than 0.1 mm may not be objectionable. But in proportion as the substrate thus increases in convex height, the configuration of the substrate, and particularly the end configuration of the substrate not only changes in its regular size but also there comes out a tendency of forming of the substrate to become troublesome. In contrast thereto, when the substrate is reduced in convex height to a size less than 0.02 mm, there is a tendency of the diminishing rate of percent defect to become not so conspicuous as shown in test example in Table I.

Thus, recourse may be had to any method most suitable to an intended method of forming a substrate of ceramics and forming a convex portion on the end face of the substrate such as for example a method of forming a convex portion on the end face of a substrate after example used in a semiconductor device or the like and assembled on an automatic assembling line, the ceramic substrate of the invention is highly useful for increased yield, better quality, and high reliability.

What is claimed is:

1. A ceramic substrate having an integral convex portion formed on the end faces of the outer circumference of the substrate, wherein said convex portion is disposed such that when said substrate comes into end face contact with a second substrate also having such a convex portion, the convex portions of each substrate will contact each other thereby reducing the likelihood of damage to said substrate 2. A ceramic substrate according to claim 1 wherein said convex portion is formed singly or plurally in the direction of vertical plane of the end faces of said substrate.

3. A ceramic substrate according to claim 1 wherein said convex portion is formed singly or plurally in the direction of horizontal plane of the end faces of said substrate.

4. A ceramic substrate according to claim 1 wherein the ratio of the height of each said convex portion, from base to apex, compared to the thickness of said substrate, measured perpendicular to the height of said convex portion, is in the range of approximately 0.013 to 0.066.

5. A ceramic substrate having top and bottom surfaces, a plurality of sides, and integral convex protrusions extending outwardly from said sides bounded by said top and bottom surfaces, wherein said convex protrusions are disposed on said sides such that during side-to-side contact with a second substantially identical substrate, the convex portions of each substrate will impinge upon one another thereby reducing the likelihood of damage to said substrate.

6. A ceramic substrate according to claim 5 wherein said substrate has a generally rectangular configuration and said protrusions extend along the length of each of said sides.

7. A ceramic substrate according to claim 5 wherein the ratio of the height of each said convex protrusion, from base to apex, compared to the thickness of said substrate, measured perpendicular to the height of said convex portion, is in the range of approximately 0.013 to 0.066.

8. A ceramic substrate according to claim 5 wherein said convex protrusions form a generally arcuous configuration along the length of each of said sides.

* * * * *